United States Patent [19]

Go et al.

[11] Patent Number: 6,150,262
[45] Date of Patent: Nov. 21, 2000

[54] SILVER-GOLD WIRE FOR WIRE BONDING

[75] Inventors: Bernard A. Go; Vivian R. Bischocho, both of Baguio, Philippines

[73] Assignee: Texas Instruments Incorporated, Dallas, Tex.

[21] Appl. No.: 08/829,911

[22] Filed: Mar. 27, 1997

Related U.S. Application Data

[60] Provisional application No. 60/014,202, Mar. 27, 1996.
[51] Int. Cl.⁷ .......................... H01L 21/50; H01L 21/20; H01L 21/44
[52] U.S. Cl. .......................... 438/650; 438/111; 438/118; 438/382; 438/612; 438/617; 438/618; 438/650; 438/686; 438/687; 438/688; 257/741; 257/690
[58] Field of Search .................................. 438/650, 455, 438/618, 686–688, 382, 118, 393, 111, 612, 617; 29/592.1; 257/741, 690

[56] References Cited

U.S. PATENT DOCUMENTS

| | | | |
|---|---|---|---|
| 3,591,838 | 7/1971 | Fujiwara et al. | 257/742 |
| 3,784,887 | 1/1974 | Sheard | 361/305 |
| 3,816,097 | 6/1974 | Daiga | 75/252 |
| 4,199,416 | 4/1980 | Middleton et al. | 205/239 |
| 4,276,086 | 6/1981 | Murao | 420/587 |
| 4,414,444 | 11/1983 | Schneider | 219/21.85 |
| 5,002,218 | 3/1991 | Ueoka et al. | 228/121 |
| 5,276,955 | 1/1994 | Noddin et al. | 29/593 |

*Primary Examiner*—John F. Niebling
*Assistant Examiner*—Ha Tran Nguyen
*Attorney, Agent, or Firm*—Wade James Brady, III; Frederick J. Telecky, Jr.

[57] ABSTRACT

A wire and method of making the wire for use in conjunction with the fabrication of semiconductor devices which consists essentially of forming one of an alloy or composite of from a finite amount approaching zero to about 50 percent by weight of at least one of carbon and the metals taken from the class consisting of platinum, silver and electrically conductive base metals and the rest gold. A wire is then formed from the alloy or composite. The noble metal alloyed with gold is preferably silver and the base metals that can be used are preferably copper or aluminum.

10 Claims, No Drawings

SILVER-GOLD WIRE FOR WIRE BONDING

This application claims benefit of Provisional Application Ser. No. 60/014,202, filed Mar. 27, 1996.

BACKGROUND OF THE INVENTION

1. Field of the Invention

This invention relates to wire for use in making electrical connection between plural locations and, more specifically, to a gold-metal alloy or metal filled composite gold wire and preferably silver-gold (Ag—Au) alloy wire, generally for use in the fabrication of semiconductor devices.

2. Brief Description of the Prior Art

The wiring of choice for use in the fabrication of semiconductor devices has generally been gold of controlled purity. By controlled purity it is meant that the gold has additives in parts per million (i.e., generally much less than one percent and further generally much less than 0.1 percent) to provide additional strength, yet retain good bondability to pads on semiconductor chips and lead frames, malleability and forming properties. The small differences in additives in parts per million can and often do make large differences in the hardness of the gold wire as well as in its other physical properties. To run a wire and form a ball bond therewith during semiconductor fabrication, it is highly desirable to have a readily malleable, easily formed alloy of gold. Materials other than gold have been used for electrical interconnection in semiconductor devices, these materials generally being aluminum and copper, though other base metals can also be used, however these base metals as well as other noble metals have not proven to provide as satisfactory results as gold.

The prior art gold wiring as described above provides excellent electrical interconnection, malleability and bondability and is therefore highly desirable for the properties it provides, however gold is very costly. As a factor in the constant attempt at cost reduction in the fabrication of semiconductor devices, the cost of wiring must be considered. The prior art cost reduction attempts have utilized materials other than gold and have generally not proven to be highly satisfactory, this being the principal reason for gold of controlled purity being the interconnect wiring material of choice.

SUMMARY OF THE INVENTION

In accordance with the present invention, there is provided a wire and method of making the wire for use in wire bonding in conjunction with the fabrication of semiconductor devices which is an alloy of gold or which is a gold-metal composite (gold filled with a metal which does not form an alloy), the preferred wire material being an alloy of gold and silver. Homogeneity of the wire material is not required, though desirable. Gold and silver can form a gold-silver alloy having from a finite amount of silver approaching zero up to a finite amount of gold approaching zero with the remainder the other of gold and silver. A preferred ratio range by weight of gold to silver for wire in the fabrication of semiconductor devices is from about a finite amount of silver approaching zero to about 50% silver and 50% gold by weight and possibly as high as 60% silver and 40% gold by weight, it being understood that best results will be obtained with the maximum amount of gold with impurities added thereto as are added in the prior art. A 100% silver wire does not work due to difficulty in ball formation prior to ball bond. The alloying or composite material can be one or more of a noble metal and/or a base metal which, when combined with gold, provide a wire that is highly electrically conductive, flexible and highly malleable, non-corrosive or highly corrosion resistant and easily bondable to semiconductor bond pads and semiconductor lead frames. The ratio of gold to other metal is a tradeoff between economics and the properties required for the intended end use of the wire. A preferred ratio range by weight of gold to base metal for wire in the fabrication of semiconductor devices is from about a finite amount of base metal approaching zero to about 50% silver and 50% gold by weight plus standard impurities as required according to the prior art.

While silver is the preferred material to combine with the gold as an alloy in accordance with the present invention, other less desirable candidates can be used in the same weight percentages as silver with gold to form an alloy or composite with gold, such as one or more of noble metal platinum and base metals, preferably copper and aluminum, the latter two also alloying with gold. Other less desirable metals that can be used in place of silver as discussed above are palladium, lead, nickel, ruthenium and osmium as well as the non-metal carbon when used as a very fine dust. In this regard, gold is alloyed with or a non-alloy composite with gold is made with a base metal or metals having characteristics as close as possible to those of gold as listed above. This material can be alloyed or combined as a composite with gold without much difficulty (difficulty being determined by a cost-benefit analysis). The composite can be formed, for example, by powderizing the materials which will form the composite with gold and then melted with the gold. The above noted metals have a high temperature melting point so as not to merge with the gold during the melting process. The alloying or composite metal acts somewhat as an extender for the much more costly gold, though it also has good electrical conductivity. By substituting a volume of the filler/alloy metal for some of the gold without a significant sacrifice in electrical conductivity, malleability, bonding capability, etc. the cost of the wire is diminished. It follows that any metal or combination of metals which are capable of alloying with or acting as a composite with gold, is electrically conductive and is capable of making a good bond with a bond pad, lead frame finger or the like, can be used as the filler/alloy. Silver has been found to be the preferred filler/alloy at this time.

In the case of all of the alloys and composites noted above, the ratio of gold to other component may be slightly altered by including, in relatively small amounts, a mixing element to aid in forming the alloy or composite, when required.

DESCRIPTION OF THE PREFERRED EMBODIMENTS

EXAMPLE 1

9 grams of pure gold and 1 gram of pure silver with no additives were melted in a crucible in standard manner and allowed to cool. The solid alloy of gold and silver was then formed into a wire.

EXAMPLE 2

5 grams of pure gold and 5 grams of pure silver with no additives were melted in a crucible in standard manner and allowed to cool. The solid alloy of gold and silver was then formed into a wire.

EXAMPLE 3

9 grams of pure gold and 1 gram of pure copper with no additives were melted in a crucible in standard manner and allowed to cool. The solid alloy of gold and copper was then formed into a wire.

EXAMPLE 4

5 grams of pure gold and 5 grams of pure copper with no additives were melted in a crucible in standard manner and allowed to cool. The solid alloy of gold and copper was then formed into a wire.

EXAMPLE 5

9 grams of pure gold and 1 gram of pure aluminum with no additives were melted in a crucible in standard manner and allowed to cool. The solid alloy of gold and aluminum was then formed into a wire.

EXAMPLE 6

5 grams of pure gold and 5 grams of pure aluminum with no additives were melted in a crucible in standard manner and allowed to cool. The solid alloy of gold and aluminum was then formed into a wire.

EXAMPLE 7

9 grams of pure gold and 1 gram of pure palladium with no additives were melted in a crucible in standard manner and allowed to cool. The solid alloy of gold and palladium was then formed into a wire.

EXAMPLE 8

5 grams of pure gold and 5 grams of pure palladium with no additives were melted in a crucible in standard manner and allowed to cool. The solid alloy of gold and palladium was then formed into a wire.

EXAMPLE 9

9 grams of pure gold and 1 gram of pure carbon powder with no additives were heated in a crucible in standard manner until the gold melted and allowed to cool. The composite of gold and carbon was then formed into a wire.

EXAMPLE 10

5 grams of pure gold and 5 grams of pure carbon powder with no additives were heated in a crucible in standard manner until the gold melted and allowed to cool. The composite of gold and carbon was then formed into a wire.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modification.

What is claimed is:

1. A method of making a wire for wire bonding in conjunction with the fabrication of semiconductor devices which comprises the steps of:

(a) forming one of an alloy or composite of (i) from a finite amount approaching zero to about 50 percent by weight of at least one of carbon and the metals taken from the class consisting of platinum, silver, copper, aluminum, palladium, lead, nickel, ruthenium and osmium and (ii) the remainder gold; and (b) forming an electrically conductive wire capable of use in wire bonding in the fabrication of semiconductor devices from said one of an alloy or composite.

2. The method of claim 1 wherein said one of the metals in (a) is silver.

3. The method of claim 2 wherein the ratio of gold to silver by weight is about 9:1.

4. The method of claim 2 wherein the ratio of gold to silver by weight is about 1:1.

5. The method of claim 1 wherein said one of said metals in (a) is aluminum.

6. The method of claim 5 wherein the ratio of gold to aluminum by weight is about 9:1.

7. The method of claim 5 wherein the ratio of gold to aluminum by weight is about 1:1.

8. The method of claim 1 wherein said one of said metals in (a) is copper.

9. The method of claim 8 wherein the ratio of gold to copper by weight is about 9:1.

10. The method of claim 8 wherein the ratio of gold to copper by weight is about 1:1.

* * * * *